United States Patent [19]

Hale

[11] Patent Number: 5,233,918
[45] Date of Patent: Aug. 10, 1993

[54] REUSABLE SCREEN PRINTING PROCESS AND APPARATUS

[76] Inventor: David Hale, 539 Keene Ave., Wayzata, Minn. 55391

[21] Appl. No.: 804,354

[22] Filed: Dec. 9, 1991

[51] Int. Cl.⁵ ............................................. B41L 13/08
[52] U.S. Cl. .................................. 101/122; 101/128.4; 101/129; 101/DIG. 48
[58] Field of Search ............ 101/50, 121, 122, 128.21, 101/128.4, 129, DIG. 48; 118/406; 427/143; 430/308

[56] References Cited

U.S. PATENT DOCUMENTS

| | | | |
|---|---|---|---|
| 2,616,961 | 11/1952 | Groak | 101/128.4 |
| 4,214,522 | 7/1980 | Bille | 101/129 |
| 4,718,340 | 1/1988 | Love | 101/128.4 |

FOREIGN PATENT DOCUMENTS

| | | | |
|---|---|---|---|
| 3441593 | 5/1986 | Fed. Rep. of Germany | 101/128.4 |
| 61493 | 5/1980 | Japan | 101/129 |

Primary Examiner—Edgar S. Burr
Assistant Examiner—Stephen R. Funk

[57] ABSTRACT

A screen printing process and apparatus for automatic coating, exposing and developing of a continuous belt-type printing screen. A segment of the belt is coated with photoemulsion, then dried, selectively exposed, and developed. After drying again, the segment is wetted with ink and the developed image is transferred to paper or other medium. After transferring the image, the segment is conveyed to baths to loosen and remove both residual ink and the emulsion. The segment is then coated again, completing a cycle. The medium receiving the image is dried and then may be re-inserted to be de-inked and reused. This is accomplished by sublimation transfer. Exposure of the emulsion coating of the printing screen by a video display device such as liquid crystal, light emitting diodes or cathode ray tube is discussed.

12 Claims, 4 Drawing Sheets

REUSABLE SCREEN PRINTING PROCESS AND APPARATUS

BACKGROUND

1. Field of the Invention

The invention relates to photo-/electro-mechanical generation of hard-copy images from a CRT, light emitting diodes, a liquid crystal display, or other means, onto paper; such images being removable by the invention.

2. Discussion of Prior Art

To reduce the cost of paper for documents and the waste and expense of present recycling limitations, and for space which is limited for stocking paper, a process is needed to allow users to reclaim paper on the spot. Conventional inks for printing, typing and copying are not readily removed. An alternative process utilizing an appropriate ink is needed. The invention addresses this need with a wet printing process having the added advantage of a reusable medium requiring no master or hard copy to achieve an image on paper.

In the decorating of textiles, ceramics, metal and other surfaces, the process of sublimation-transfer is often used. Wrong-reading images are litho-, screen-, or electrostatically-printed on appropriate paper and transferred to the final product by direct contact of the printed paper with the substrate under pressure and heat. The sublimation dyes in the ink vaporize and transfer to the substrate. The extent of sublimation-how much of the dye is removed from the paper vs. how much remains-depends on the absorbancy and nature of the substrate and the time, temperature and pressure used in the transfer process. The invention uses this process, not for decorating a substrate but for removing printed images from paper.

In the decorating application of sublimation-transfer, it is not necessary to sublimate all of the ink which is printed on the paper, but, given certain conditions, it is possible to do virtually that. One condition is that the ink used be as close as possible to the raw sublimation material.

While it is possible to apply sublimating powders to paper using xerography or electrostatic processes, this requires contaminants which allow the images to develop and fix. These methods are therefore inappropriate for generating removable images.

The invention also addresses image processing and duplicating. Existing printers and duplicating devices utilize elaborate optics and complicated, often digital circuitry. These factors and the expensive toners used result in high costs. The invention requires only traditional, analog television circuitry and less expensive ink.

The use of a cathode ray tube (CRT) to transfer images to a printing medium is known in the art and is addressed in a number of patents. In U.S. Pat. No. 4,134,668 Richard Coburn shows means to optically transfer images from a CRT to a xerographic medium. In U.S. Pat. No. 3,681,527 Shizuo Nishiyama and Makoto Tanaka show a CRT "pin" tube in a similar use. In U.S. Pat. No. 4,264,912 William Okamura, Anthony Norman, and Manindra Mitra show a CRT pin tube used to form images on an electrostatic belt. In U.S. Pat. No. 4,231,061 Samuel Freeman shows a CRT with fiber-optic faceplate to expose a diazo film and describes the proper phosphors to achieve this. These methods address the use of a CRT to produce latent images on paper or media but do not show exposure of a screen printing medium as is essential to this invention and which is discussed below.

SUMMARY OF THE INVENTION

According to the invention, an image displayed is transferred to a belt-type printing medium of "silkscreen" printing fabric, which is coated within the process with liquid photoemulsion. This coating is dried and then exposed by direct contact of the belt with the face of the display device, the phosphor screen of the CRT or a fiber-optic faceplate of the CRT, depending on the requirements of the user.

Further, means are described to develop the image and print it onto paper inserted by the user and tractor- or sheet-fed, using existing art.

Further, means are described to remove the image from both the medium and the paper copy.

The following descriptions will detail the process and preferred embodiments.

Images, displayed on a cathode ray tube (CRT) or other display device, are processed onto a belt-type printing screen (25) and, subsequently, from the printing screen to print-receiving medium (paper)(26) by means of the invention. The information being processed onto the printing screen is produced, used and removed from the printing screen within a device employing the invented process. The information being processed is printed on the paper within the device. The paper is output to the user, used and re-supplied to the device, where it is erased and reused.

In either of the embodiments described, the print-receiving medium (paper)(26), be it plain or coated, continuous or single sheet—depending on the user's requirements—is loaded by the user, using existing art of the tractor, sheet-fed, or pinch-roller (31) method.

Upon entering the device, guides (32 a-d) direct the paper into the paper reclaiming station where the paper dwells to have the sublimation ink removed. The ink removal is accomplished by a solid heat source (illustrated as rollers (22)) pressing the printed side of said paper against a synthetic, disposable, absorbant receiver (illustrated as absorbant rollers (23)) such as polyester, acrylic or nylon for a predetermined period.

Assuming any ink on the paper is the removable, sublimation type, the paper is erased as it is transported to the print station described hereafter.

DESCRIPTION OF PREFERRED EMBODIMENTS

Mode One: Copying

Figure 1:
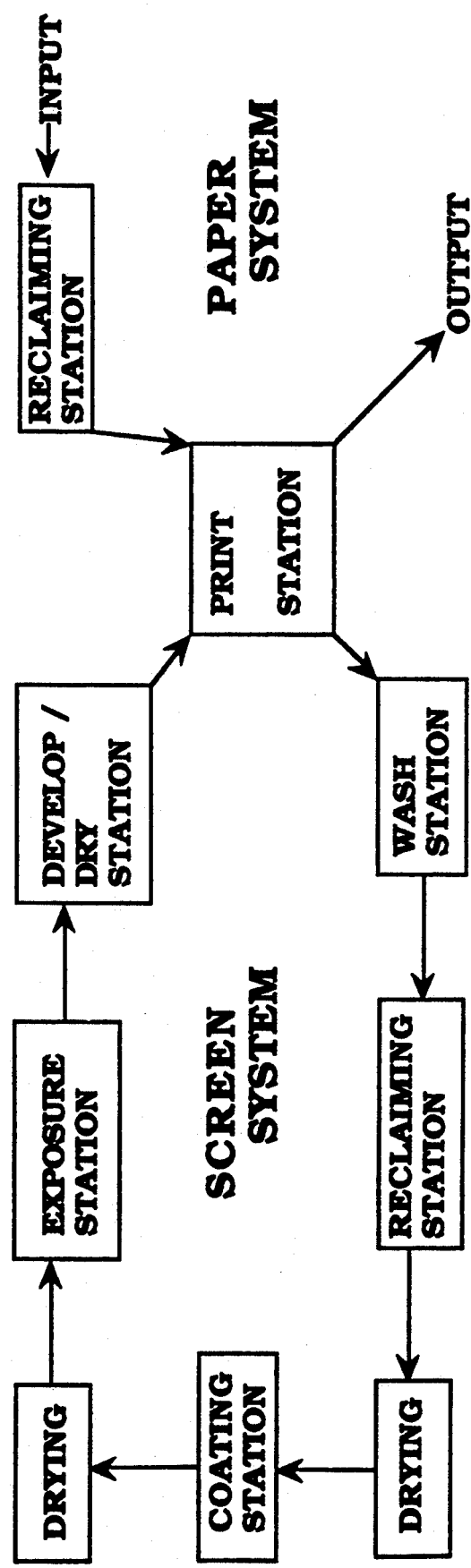
FIG. 1 is a flow chart of the invention.
Figure 2:
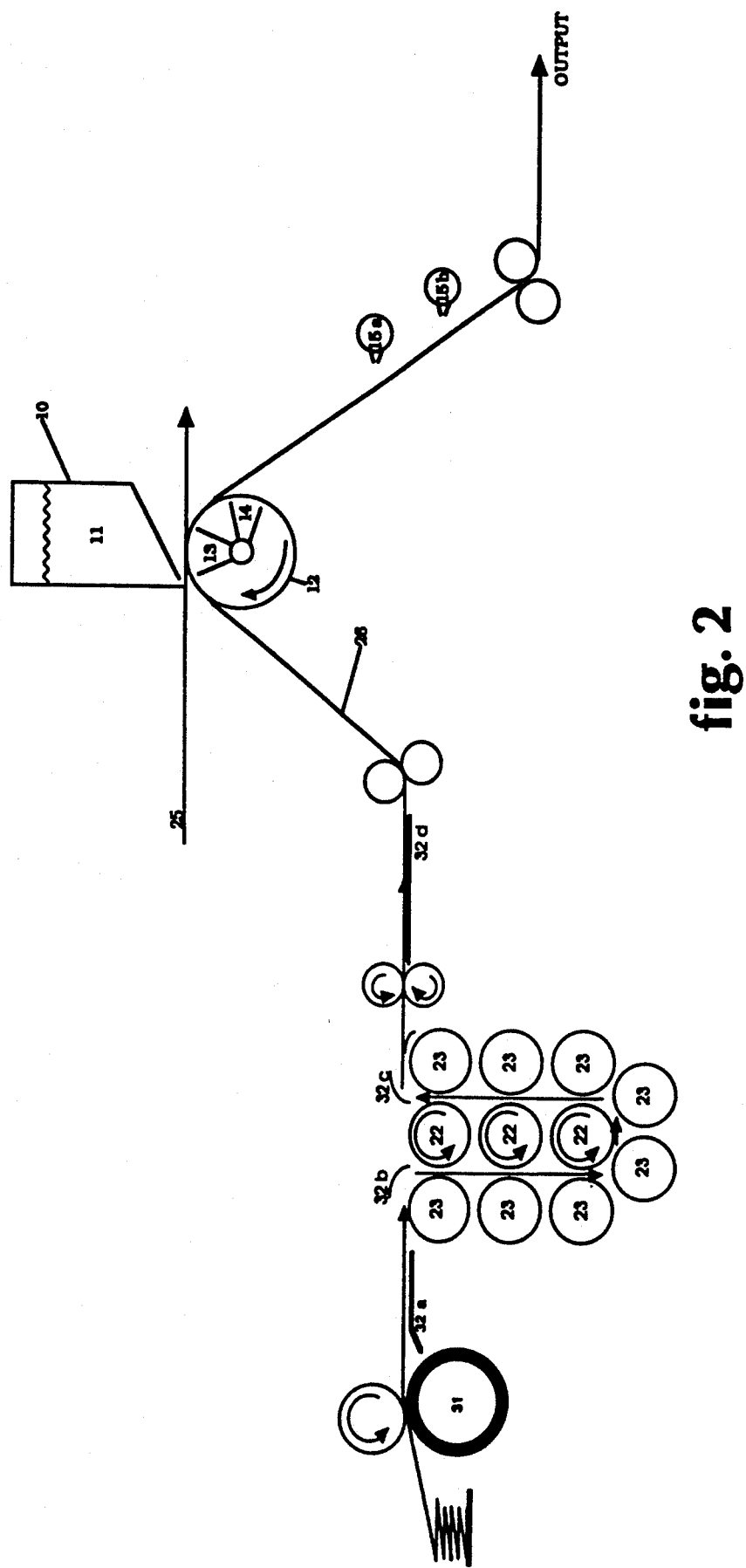
FIG. 2 is a side view of that portion of the invention involving the paper, including the printing station and a cluster of rollers comprising the reclaiming station.
Figure 3:
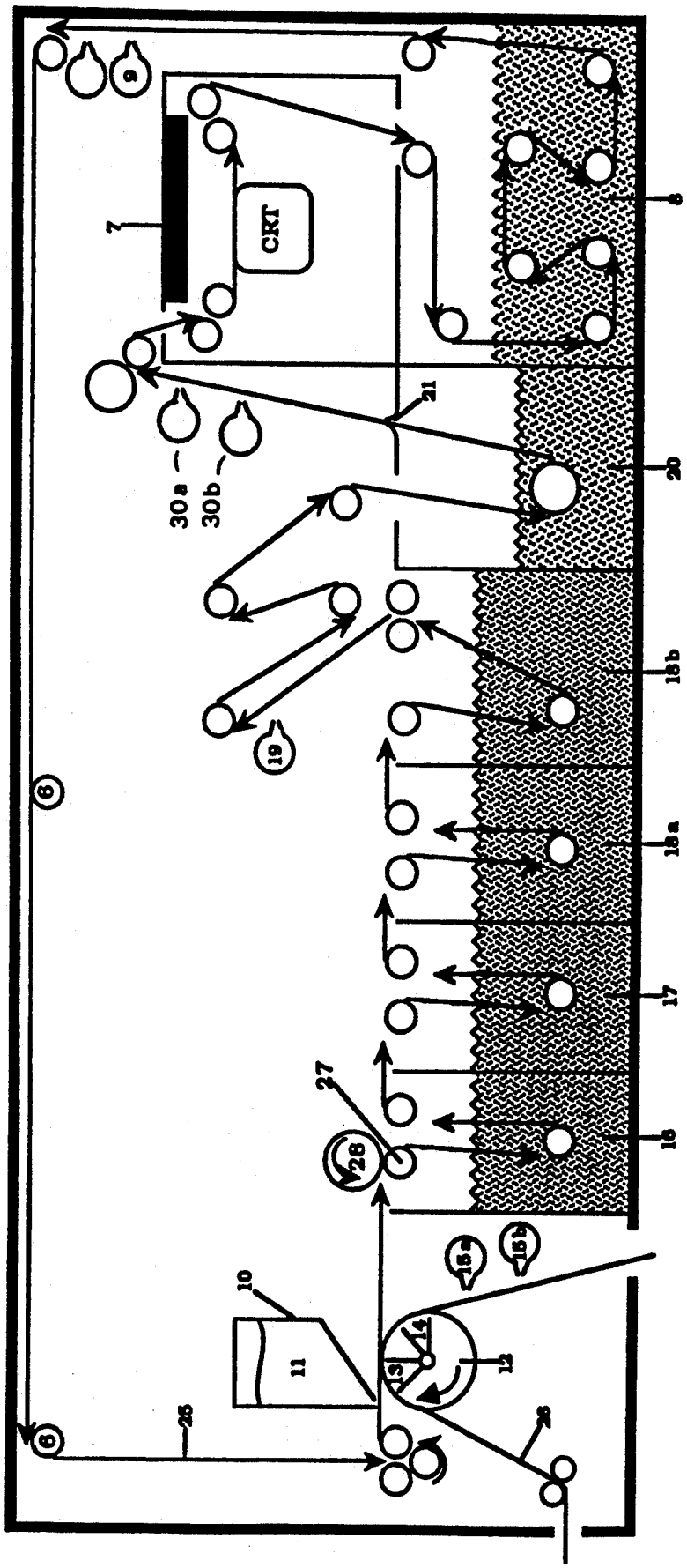
FIG. 3 is a side view of that portion of the invention involving the printing screen, including the printing station, and a video display device, labeled as a CRT.
Figure 4:
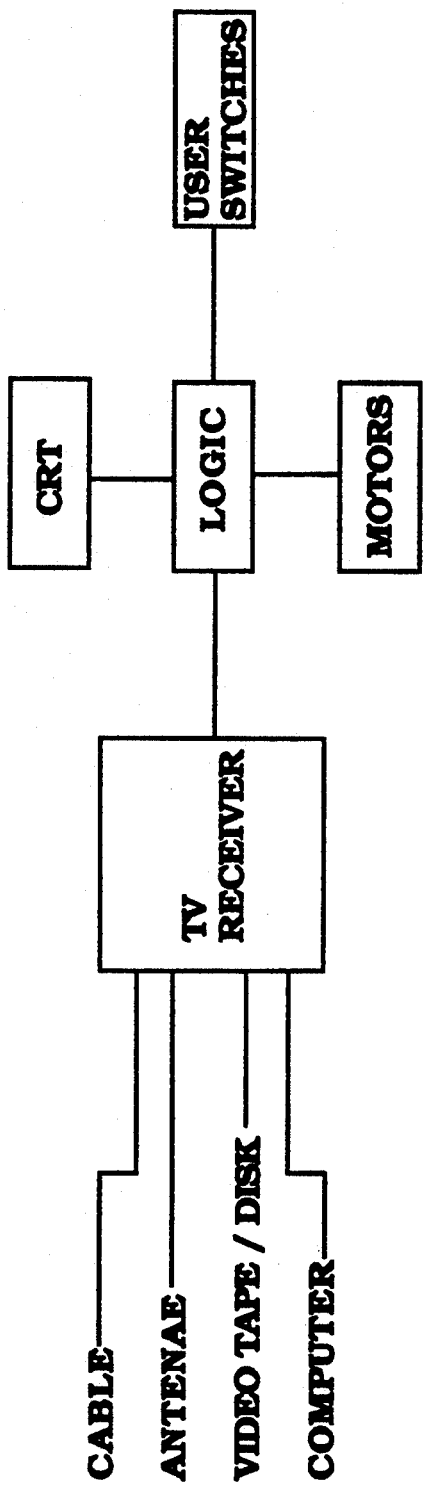
FIG. 4 is a flow chart of the circuitry of the invention.

In this mode, the original document is digitized, scanned or photographed with video camera by equipment peripheral to, and not pertinent to, this invention. This information is then displayed on a display device or stored on peripheral computer storage, video tape or video disc using existing art. Whether immediately (by direct display to device) or via storage, the image is ultimately delivered to the display device.

A CRT utilized should be of the low-curvature type or equipped with a flat fiber-optic faceplate, available from Thomas Electronics, Inc., Wayne, N.J. and other sources, as mentioned by Freeman in U.S. Pat. No. 4,231,061, to allow conformity between the printing medium and the CRT and produce a near-ultraviolet output, as also discussed by Freeman in U.S. Pat. No. 4,231,061, to properly expose the photoemulsion on the medium as described below.

The belt is threaded through, guided, and supported by a plurality of rollers (6). By way of a pinch roller (27) opposed to a drive roller (28), a photosensitive segment of the belt is transported to, and in contact with, the display device (which may be without faceplate or with flat, fiber-optic faceplate, depending on user requirements) where it dwells for a predetermined period to absorb light from lit areas on the display device, on which a still image is maintained. The width of the belt and the display device are determined by the size of the sheet to be printed. The length of the belt is a multiple of the length of the sheet to be printed, determined by the physical construction of the apparatus employing the process. Contact may be achieved by applying tension to the belt across the display device with a non-reflective background (7) positioned parallel to the face of the display device behind the belt to collect any light which penetrates the belt, preventing exposure of the information areas of the belt from behind. Or, using known art, a blanket may be drawn by air against the belt to press it against the surface of the display device. The near-ultraviolet light emitted by the display device hardens or polymerizes the diazo or photopolymer emulsion on the printing screen. Areas of the screen which are not in contact with lit areas will remain uncured, and the emulsion there will dissolve in water. A two-dimensional latent image has now been formed, in one step, on the printing belt.

The image processing rate may be increased by using plural display devices displaying the same image or a succession of images. In this embodiment, the belt would be transported a plural number of times between dwell periods, this number to be equal to the number of display devices.

The printing screen, now exposed, is next transported to a developing station (8). Here, it dwells in water which may be agitated to facilitate development. Unexposed areas of the emulsion will dissolve and leave the screen. The screen is next transported to air-knives (9) which drive residue from the open areas of the screen. The hardened or polymerized emulsion now constitutes a stencil. The belt segment containing the stencil now constitutes a printing screen.

After dwelling at the air-knife station, the printing screen is transported to the printing station.

At the printing station, the printing screen passes an ink fountain (10) where it is wetted with liquid ink (11) of the water-based or solvent-based sublimation transfer type, according to user requirements. The printing screen is stretched taught. As the printing screen is transported to its next dwell station, it comes in minimal contact with the paper (26) discussed above at the printing drum assembly (12). The paper is attracted to the printing drum assembly, whose axis of rotation is perpendicular to the path of the screen and has a rotational speed synchronized with the speed of the moving belt. Air is drawn through the porous drum during rotation by vacuum (13) within the drum assembly and subsequently through the paper to attract the ink from the screen through open areas of the stencil. The result is an impression of the information, originally displayed on the display device, on the paper.

Plural copies may be produced by then transporting the printing screen in the reverse direction while the paper remains stationary and repeating the printing process in the original direction. This allows plural copies of a single image or a series of images, resulting in an output of pages in sequence, eliminating the need of collating.

The paper is released from the drum after printing by blowback (14) within the drum assembly.

The paper is transported to a drying station to dwell at air-knives (15a and b) and then to output for the user.

The printing screen is then transported to the first of six stations. The first station (16) soaks the screen in an appropriate bath, i.e., water for water-based ink or solvent for solvent-based ink. Again, it dwells according to the parameters discussed in its earlier processing.

The next station (17) where it dwells is a rinse station to remove any ink not removed in the first bath. Then (if solvent-based ink was used, it is dried and) it is transported to the screen reclaiming stations (18a and b) where it dwells in chlorine or industrial stencil remover available from screen printing suppliers.

Next, it is transported to a drying station utilizing an air-knife (19) to dwell before being transported to a coating station (20) where it is immersed in liquid photoemulsion, available from screen printing suppliers, which is wiped by squeegees (21) to provide optimum deposit of the emulsion.

Next, it dwells at a drying station utilizing air-knives (30a and b) and is ready to begin the cycle again from the display device.

Each station mentioned above involves a dwell time, resulting in a transport/dwell/transport/dwell process.

It should be noted that as one segment of the belt is exposed, another is developed; another is dried, yet another is immersed in photoemulsion, etc.

Also, while the printing process is discussed in detail, it should not be construed as a limitation to the invention of a method for producing and removing hardcopy images. The sublimating ink may be applied by conventional impact or ink-jet means, although such impressions may be more difficult to remove.

Mode Two: Printer

As a printer, the process is identical to the copying embodiment above except the information is delivered to the display device by computer, broadcast or cable television via conventional television receiving circuitry.

This process would allow information to be delivered to a large number of users for hard copy output with or without telephone lines. In this embodiment, the category or page number of the information might be identified on the audio carrier of the television signal. Given appropriate circuitry within the device, this could allow users to discriminate between wanted and unwanted information and instruct the device to ignore the unwanted displays.

Of particular interest here is the possibility of a customized newspaper. This would operate not on word-recognition, but on frequency-recognition. A category, such as financial news, could be identified by a particular frequency, recognized by the device as true or false as preset by the user. The device would then process the image and advance, or ignore the image.

CONCLUSION, RAMIFICATIONS, AND SCOPE OF INVENTION

The reader will see that a process and apparatus have been invented which allow hard copies to be produced of images employing a reusable "silkscreen" medium, said images being removable from the hard copy by using sublimation transfer. While the screen printing process is centuries old, the invented belt-type configuration is new and allows for a continuous, self-reclaiming process.

Also, while sublimation transfer is prior art, its use as a de-linking process is new and significant.

Also significant is the possibility of delivering documents, e.g., newspapers, simultaneously to multiple users via cable or broadcast television whose data can be customized by encoding each page relative to its content.

While the above description contains many specificities, they should not be construed as limitations to the scope of the Invention. For example, the method illustrated for transferring images from the printing screen to the paper uses suction. It is well known that the more popular method to this end is the use of a squeegee to force ink through the printing screen. Also, the printing surface could be a platten rather than a drum, and the receiver in the sublimation transfer assembly could be a sheet or belt.

Also, many means are known to expose printing screens. Any of these means—contact with a film positive, projection, laser or any future means—could be used and does not relate to the novelty of the belt-type screen.

Also, the substrate which receives the information need not be paper and need not be printed with removable ink.

What is claimed is:

1. A reusable screen printing apparatus for producing a series of images on a continuous printing screen in hard-copy generation, comprising:
    a) a continuous belt constructed of screen printing fabric, means for propelling the belt intermittently in a direction perpendicular to a line across a width of said belt, and a plurality of rollers for supporting and guiding said belt through said apparatus;
    b) means to coat a segment of said belt with a photosensitive film by immersing said segment in a fluid photoemulsion;
    c) wiping means for controlling the thickness of said film on said segment;
    d) means to produce an image on said segment by exposing selective areas of said film on said segment to sufficient radiation to harden said areas, and means to develop said image, whereby said developed segment constitutes a printing stencil;
    e) said plurality of rollers guiding said segment of said belt to a printing station; said printing station including means to introduce ink to said segment, and means to force said ink through said stencil on said segment onto a print-receiving medium such that said image appears on said medium;
    f) means to reclaim said segment comprising a plurality of baths to loosen said ink and said film and to separate said ink and said film from said segment of said belt;
    g) means to dry said segment and to guide said segment to said photoemulsion, such that said segment completes a cycle through said apparatus.

2. Apparatus as described in claim 1, further including means preceding said printing station to convey and de-ink said print-receiving medium, said means to convey and de-ink comprising;
    a) means to drive a segment of said print-receiving medium to a de-inking station, said de-inking station having an absorbent material where a printed surface of said print-receiving medium contacts said absorbent material;
    b) a heated element located against that surface of said segment of said print-receiving medium which is opposite said printed surface such that said print-receiving medium is pressed between said element and said absorbent material so as to de-ink said printed surface;
    c) guides to direct said print-receiving medium from said de-inking station to said printing station.

3. Apparatus as described in claim 1, further including a television receiver and circuitry to allow information delivered to said apparatus to be displayed by said image producing means, said image producing means being a cathode ray tube.

4. Apparatus as described in claim 1, further including a television receiver and circuitry to allow information delivered to said apparatus to be displayed by said image producing means, said image producing means being a liquid crystal display.

5. Apparatus as described in claim 1, further including a television receiver and circuitry to allow information delivered to said apparatus to be displayed by said image producing means, said image producing means being light emitting diodes.

6. Apparatus of claim 1, further including a vacuum means located on that side of said medium which is opposite that side of said medium which faces said stencil, wherein said ink is forced through said stencil onto said medium by said vacuum; said vacuum drawing air through said medium and drawing said ink through said stencil onto said medium.

7. Apparatus of claim 1, further including a rotatable drum whose axis of rotation is parallel to a line across the width of said belt, said medium being supported by said rotatable drum.

8. A process for printing media with a succession of images formed on a continuous belt-type printing screen comprising the steps of
    a) exposing a segment of said screen having a photosensitive coating to selective and sufficient radiation as to form a latent image on said segment;
    b) conveying said screen such that said segment advances to a developing station where said image is developed and such that a subsequent segment is brought to position for exposure;
    c) further conveying said screen such that said developed segment is brought to juxtaposition with a medium such that a line across said segment is parallel with a line across said medium;
    d) introducing ink to said segment of said screen and forcing said ink through said segment such that said image appears on said medium;
    e) conveying said segment of said screen to a plurality of baths to loosen said ink and said coating, and separate said ink and said coating from said segment;

f) conveying said segment to dry, and recoating said segment with a photosensitive coating such that previous steps may continue cyclically, thus completing a cycle of said segment of said screen.

9. In the process of claim 8, said ink being of the sublimating type.

10. The process of claim 8, wherein said ink is removed by drying said ink on said medium and conveying said medium to a de-inking station where a printed segment of said medium is brought against an absorbent material, and where said segment is pressed against said material by a heated element positioned against a surface of said segment opposite a printed surface of said segment for such time as to cause said ink to sublimate and transfer to said material.

11. The process of claim 10, thereafter conveying said medium from said de-inking station to said juxtaposition with said screen, for reprinting, concurrently with conveyance of a subsequent segment of said screen to said juxtaposition.

12. In the process of claim 8, said exposure comprising the steps of
 a) displaying an image on a video display device;
 b) establishing contact of said segment of said screen with said device;
 c) maintaining said contact for a period sufficient to allow said radiation to harden said photosensitive coating.

* * * * *